US011466190B2

(12) United States Patent
Cairoli et al.

(10) Patent No.: US 11,466,190 B2
(45) Date of Patent: Oct. 11, 2022

(54) FORCED AIR COOLING SYSTEM WITH PHASE CHANGE MATERIAL

(71) Applicant: ABB Schweiz AG, Baden (CH)

(72) Inventors: Pietro Cairoli, Cary, NC (US); Giti Karimi-Moghaddam, Apex, NC (US); Taosha Jiang, Cary, NC (US)

(73) Assignee: ABB SCHWEIZ AG, Baden (CH)

( * ) Notice: Subject to any disclaimer, the term of this patent is extended or adjusted under 35 U.S.C. 154(b) by 204 days.

(21) Appl. No.: 16/017,331

(22) Filed: Jun. 25, 2018

(65) Prior Publication Data

US 2019/0390096 A1    Dec. 26, 2019

(51) Int. Cl.
| | |
|---|---|
| *C09K 5/06* | (2006.01) |
| *G01K 13/00* | (2021.01) |
| *H05K 7/20* | (2006.01) |
| *G08B 21/18* | (2006.01) |

(52) U.S. Cl.
CPC .............. *C09K 5/063* (2013.01); *G01K 13/00* (2013.01); *G08B 21/182* (2013.01); *H05K 7/20154* (2013.01); *H05K 7/20209* (2013.01)

(58) Field of Classification Search
CPC ...... C09K 5/063; G01K 13/00; G08B 21/182; H05K 7/20154; H05K 7/20209; F28D 15/02; F28D 20/0056; F28D 20/021; F28D 20/026; F28D 20/028; H01L 23/427
USPC ........................................................ 165/80.4
See application file for complete search history.

(56) References Cited

U.S. PATENT DOCUMENTS

| | | | | |
|---|---|---|---|---|
| 4,851,956 A | * | 7/1989 | Borkowicz | ........... H01L 23/051 361/118 |
| 6,227,287 B1 | * | 5/2001 | Tanaka | ................ F28D 15/0233 165/104.26 |
| 6,487,076 B1 | * | 11/2002 | Wang | ........................ G06F 1/20 165/80.3 |
| 6,631,077 B2 | * | 10/2003 | Zuo | ....................... H01L 23/433 361/699 |
| 6,631,755 B1 | * | 10/2003 | Kung | ...................... F28D 15/02 165/104.14 |

(Continued)

OTHER PUBLICATIONS

International Search Report and Written Opinion issued in corresponding international application No. PCT/US2019/038743, dated Aug. 30, 2019, 8 pp.

*Primary Examiner* — Tho V Duong
*Assistant Examiner* — Raheena R Malik
(74) *Attorney, Agent, or Firm* — Greenberg Traurig, LLP

(57) ABSTRACT

A system and method for maintaining a temperature of a power system using a cooling system that includes an impeller and a phase change material. During normal operation of the cooling system, heat that is generated by the operation of an electronic device(s) of the power system can be transferred primarily by conduction through an upper base plate and fins of a heat sink, and dissipated via forced convection that is generated by the impeller. Additionally, the phase change material is positioned outside of a main heat flux path of the heat sink such that, during normal operation of the cooling system, the phase change material does not provide a heat flux obstruction. In the event of an impeller failure, the phase change material provides at least a temporary cooling source for an extended period of time via the relatively large latent heat capacity of the phase change material.

20 Claims, 5 Drawing Sheets

(56) References Cited

U.S. PATENT DOCUMENTS

| | | | | |
|---|---|---|---|---|
| 6,639,799 B2* | 10/2003 | Prasher | ................ | H01L 23/427 165/80.4 |
| 6,779,593 B1 | 8/2004 | Hegde | | |
| 6,779,595 B1* | 8/2004 | Chiang | ................ | H01L 23/427 165/104.33 |
| 6,781,835 B2* | 8/2004 | Hashimoto | ......... | F04D 29/4213 165/121 |
| 6,826,049 B2* | 11/2004 | Chen | .................... | H01L 23/427 165/104.33 |
| 6,909,608 B2* | 6/2005 | Fan | ...................... | H01L 23/427 165/104.21 |
| 6,988,534 B2* | 1/2006 | Kenny | ................... | F04B 17/00 165/104.21 |
| 6,992,887 B2* | 1/2006 | Jairazbhoy | ............ | H01L 23/473 165/80.4 |
| 7,021,368 B2* | 4/2006 | Lin | ...................... | H01L 23/427 165/104.33 |
| 7,077,189 B1* | 7/2006 | Reyzin | .................... | F28D 15/00 165/104.21 |
| 7,167,364 B2* | 1/2007 | Lopatinsky | ........... | H01L 23/467 165/122 |
| 7,228,889 B1* | 6/2007 | Tian | ...................... | H01L 23/427 165/104.34 |
| 7,278,468 B2* | 10/2007 | Joshi | .................... | H01L 23/473 165/139 |
| 7,342,785 B2* | 3/2008 | Liu | .................... | F28D 15/0233 361/695 |
| 7,414,846 B2* | 8/2008 | Cheng | ...................... | G06F 1/20 165/104.33 |
| 7,443,675 B2* | 10/2008 | Hsiao | ........................ | G06F 1/203 165/104.26 |
| 7,466,548 B2* | 12/2008 | Ishikawa | ............. | H01L 23/4006 361/698 |
| 7,499,278 B2* | 3/2009 | Sauciuc | ............. | F28D 15/0241 165/104.29 |
| 7,509,995 B2* | 3/2009 | Bhatti | ................. | F28D 15/0233 165/80.3 |
| 7,527,085 B2* | 5/2009 | Iijima | ................. | F28D 1/05375 165/104.33 |
| 7,568,517 B2* | 8/2009 | Hwang | ................. | H01L 23/427 165/104.21 |
| 7,597,135 B2* | 10/2009 | Ghosh | ................. | H01L 23/4336 165/104.33 |
| 7,652,884 B2* | 1/2010 | Suzuki | .................... | G06F 1/203 361/699 |
| 7,672,125 B2* | 3/2010 | Suzuki | .................... | G06F 1/203 361/695 |
| 7,701,715 B2* | 4/2010 | Suzuki | .................... | G06F 1/203 361/699 |
| 7,710,722 B2* | 5/2010 | Suzuki | .................... | G06F 1/203 361/699 |
| 7,907,403 B2* | 3/2011 | Malone | ................. | H01L 23/467 361/695 |
| 7,965,511 B2* | 6/2011 | Refai-Ahmed | ....... | H01L 23/427 361/700 |
| 8,861,201 B2* | 10/2014 | Hata | .................... | F28D 15/046 361/700 |
| 8,941,994 B2* | 1/2015 | Campbell | .......... | H05K 7/20809 361/701 |
| 9,013,877 B2* | 4/2015 | Harubeppu | ............. | H01L 23/42 361/702 |
| 9,019,704 B2* | 4/2015 | Rubenstein | ............. | F28D 20/02 361/699 |
| 2004/0145868 A1 | 7/2004 | Nair et al. | | |
| 2007/0058343 A1 | 3/2007 | Deng et al. | | |
| 2007/0105212 A1 | 5/2007 | Oldham et al. | | |
| 2007/0214820 A1* | 9/2007 | Olarig | ....................... | G06F 1/26 62/259.2 |
| 2012/0125573 A1* | 5/2012 | Rubenstein | ........... | H01L 23/473 165/104.33 |
| 2014/0036445 A1 | 2/2014 | Okamoto et al. | | |
| 2017/0067693 A1* | 3/2017 | Rush | ........................ | F28F 7/02 |

\* cited by examiner

FORCED AIR COOLING SYSTEM WITH PHASE CHANGE MATERIAL

BACKGROUND

Embodiments of the present application generally relate to forced air cooling systems. More particularly, but not exclusively, embodiments of the present application relate to forced air cooling systems for solid state switches that utilize phase change materials.

The reliable operation of a variety of different types of electronic devices can depend on a many factors, including, but not limited to, the dependable operation of an associated cooling system. For example, in order to comply with relatively high standards of operation, reliable operation of switching devices, such as connectors, circuit breakers, and relays, among other types of devices, often rely on the continued operation of a cooling system(s) to dissipate at least a portion of the heat generated by the operation of at least the switching device(s). Further, unexpected failures or interruptions in the operation of the cooling system can result in damage to, and/or the interruption in the service of, the electrical device and/or the associated devices, equipment, and/or systems.

Two general types of cooling systems utilize either ambient air or forced air to at least attempt to satisfy the cooling demands of the associated electrical device(s). Unlike forced air cooling systems, the operation of ambient air systems may not rely on the uninterrupted operation of devices to generate the forced movement of a cooling medium. Thus, the design and operation of ambient air-cooling systems can generally be more reliable than forced air cooling systems. However, in at least certain situations, compared to ambient air-cooling systems, forced air-cooling systems may be able to provide better cooling performance and power density. Thus, compared to ambient cooling systems, forced air cooling systems can often provide at least certain benefits with respect to meeting the cooling demands of certain types of electrical devices. Yet, the dependency on component(s) used to move the cooling medium can at least potentially lead to the operation of forced air cooling systems being less dependable than ambient air cooling systems.

BRIEF SUMMARY

An aspect of an embodiment of the present application is a system comprising at least one electronic device and a heat sink having a proximate end and a distal end, the at least one electronic device coupled to the proximate end of the heat sink. The system can further include an impeller that is positioned to dissipate heat away from the heat sink, and a phase change material that is positioned in the heat sink at a location that is generally remote from both the at least one electronic device and the proximate end of the heat sink.

Another aspect of an embodiment of the present application is a system that includes one or more electronic devices and a heat sink having a proximate end and a distal end, the proximate end and the distal end being at opposing sides of the heat sink, and the one or more electronic devices being coupled to the proximate end. The system further includes an impeller that is positioned to dissipate heat away from the heat sink and a panel that is coupled to the heat sink by one or more fixtures. Additionally, the system can include a phase change material that is embedded within the panel.

Additionally, an aspect of an embodiment of the present application is a method that includes operating an impeller during operation of an electronic device of a power system to dissipate heat away from a heat sink, the heat sink including a phase change material that is positioned outside of a main thermal path of the heat sink. The method can further include monitoring a temperature during the operation of the electronic device, and determining whether the monitored temperature corresponds to an operating failure of the impeller. Additionally, when the monitored temperature corresponds to the operating failure of the impeller, an alarm signal can be outputted that provides an indication of at least a temporary reliance on a latent heat capacity of the phase change material to maintain a temperature of one or more components of the power system.

BRIEF DESCRIPTION OF THE DRAWINGS

The description herein makes reference to the accompanying figures wherein like reference numerals refer to like parts throughout the several views.

Figure 1:
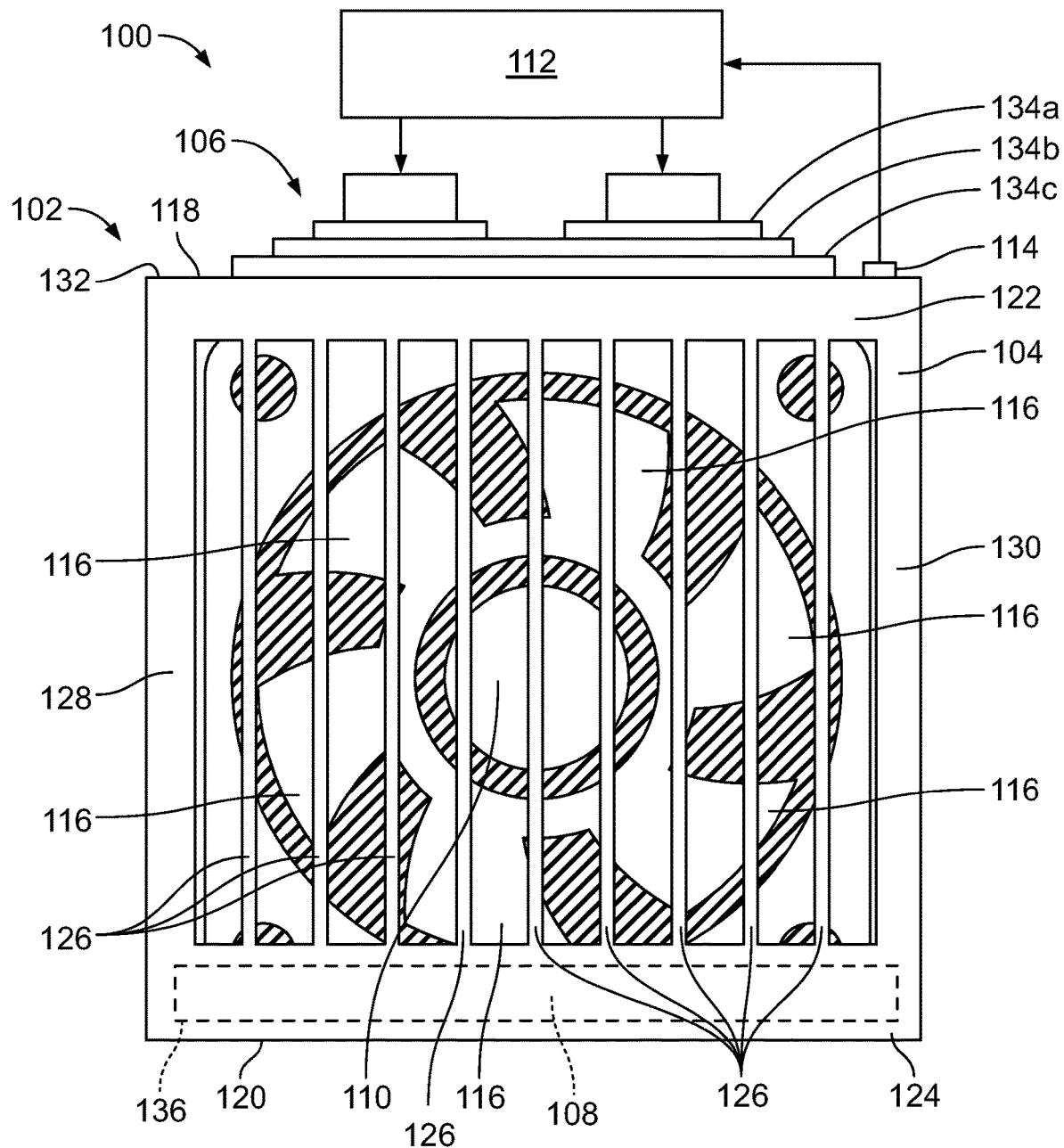
FIG. 1 illustrates a side view of a power system having an exemplary cooling system that includes a heat sink that incorporates a phase change material at a position that is generally remote from a proximate end of the heat sink.

The foregoing summary, as well as the following detailed description of certain embodiments of the present application, will be better understood when read in conjunction with the appended drawings. For the purpose of illustrating the application, there is shown in the drawings, certain embodiments. It should be understood, however, that the present application is not limited to the arrangements and instrumentalities shown in the attached drawings. Further, like numbers in the respective figures indicate like or comparable parts.

DESCRIPTION OF THE ILLUSTRATED EMBODIMENTS

Certain terminology is used in the foregoing description for convenience and is not intended to be limiting. Words such as "upper," "lower," "top," "bottom," "first," and "second" designate directions in the drawings to which reference is made. This terminology includes the words specifically noted above, derivatives thereof, and words of similar import. Additionally, the words "a" and "one" are defined as including one or more of the referenced item unless specifically noted. The phrase "at least one of"

followed by a list of two or more items, such as "A, B or C," means any individual one of A, B or C, as well as any combination thereof.

FIG. 1 illustrates a side view of a power system 100 having an exemplary cooling system 102 that includes a heat sink 104 that incorporates a phase change material 108. As shown, the cooling system 102 can be used on connection with one or more electronic devices 106 of the power system 100. For example, according to the illustrated embodiment, the one or more electronic devices 106 can be a solid state based device(s), among other types of electronic devices and/or components. Further, for example, the electronic device(s) 106 can include, but is not limited to, one or more of a power semiconductor device, a power semiconductor module, a contactor, a soft starter, a switch, a rectifier, a circuit breaker, a fuse, and a relay.

According to the illustrated exemplary embodiment, the cooling system 102 can include an impeller 110, the heat sink 104, a control circuit 112, and a temperature sensor 114. The impeller 110 is configured to facilitate the forced movement of a cooling medium, such as, for example, ambient air and is used in connection with dissipating transferred heat from the heat sink 104. According to certain embodiments, the impeller 110, which can be a fan, can be coupled to a power source that can provide power to operate the impeller 110, such as, for example, electrical power to an electrical motor of the impeller 110. The impeller 110 can also include a plurality of blades 116 that are rotated by operation of the impeller 110, such as, for example, via operation of the electronic motor of the impeller 110. Such rotation of the blades 116 via operation of the impeller 110 can facilitate the previously mentioned forced movement of the cooling medium that can draw heat away from at least the heat sink 104, such as, for example, via forced convection.

The heat sink 104 can have a variety of different shapes and configurations, and can be constructed from a variety of materials. For example, according to certain embodiments, the heat sink 104 can be constructed from aluminum, aluminum alloy, copper, or copper alloy, as well as combinations thereof, among other materials. Additionally, the heat sink 104 can be configured to at least attempt to maximize the surface area of the heat sink 104 that can come into contact with the forced cooling medium, such as, for example, the surface area of the heat sink 104 that comes into contact with at least a portion of the forced airflow that is provided by the operation of the impeller 110. Further, although the heat sink 104 can have a variety of shapes, according to the illustrated embodiment, the exemplary heat sink 104 has a generally square or rectangular cross sectional shape. Additionally, the impeller 110 can be positioned at a variety of different locations and/or orientations relative to at least the heat sink 104 and/or the electronic devices 106.

The heat sink 104 can include a proximate end 118 and an opposing distal end 120. According to the illustrated embodiment, the proximate end 118 can include an upper base plate 122, while the distal end 120 can include a lower base plate 124. Additionally, the heat sink 104 can further include a plurality of fins 126 and/or one or more sidewalls, such as, for example, a first sidewall 128 and a second sidewall 130, that generally extend between the upper and lower base plates 122, 124. Further, according to the illustrated embodiment, the first and second sidewalls 128, 130 can be on opposing sides of the plurality of fins 126.

As shown in FIG. 1, the proximate end 118 of the heat sink 104 can be coupled to the one or more electronic devices 106. For example, according to certain embodiments, an upper or bottom portion of the electronic device 112 can be positioned on, or otherwise directly or indirectly coupled to, an upper surface 132 of the upper base plate 122. Moreover, for example, according to the embodiment depicted in FIG. 1, one or more layers 134a-c of a material, such as, for example, one or more layers of a dielectric material, copper cladding, and/or adhesive, as well as any combination thereof, that is part of, or otherwise coupled to the electronic device 106 can be positioned against the upper base plate 122 of the heat sink 104.

The fins 126 of the heat sink 104 can have a variety of different shapes and configurations. For example, according to certain embodiments, the fins 126 can have a cylindrical, elliptical, or square cross sectional shape. As seen in at least FIG. 1, opposing sides of the fins 126 are each separated from an adjacent fin(s) 126 and/or sidewall 128, 130 of the heat sink 104 by a space that is sized to facilitate the flow of at least a portion of the forced cooling medium around at least a portion of the fin 126 so as to assist with the dissipation of heat via forced convection.

The phase change material 108 can have a relatively high heat of fusion that is capable of storing and releasing relatively large amounts of energy. According to the illustrated embodiment, the phase change material 108 can be embedded or encased within, or otherwise connected, attached, or coupled to, at least one of the lower base plate 124, first sidewall 128, second sidewall 130, and/or fins 126 of the heat sink 104, as well as combinations thereof. For example, according to certain embodiments, the phase change material 108 can be encased within a substrate that is attached or coupled to the heat sink 104. According to other embodiments, the heat sink 104 can include one or more cavities or recesses 136, or other hollow regions, that can sealingly receive placement of the phase change material 108 into a portion of the heat sink 104. For example, according to certain embodiments, the heat sink 104 can have one or more cavities or recesses 136 that includes a sealable or pluggable inlet opening that can provide, at least initially, a passageway for the insertion or injection of the phase change material 108 into the cavity(ies) or recess(es) 136 of the heat sink 104. Further, according to certain embodiments, the phase change material 108 can be packed in bulk into a portion of the heat sink 104, or, alternatively, can be filled into a meshed or finned structure that is part of, or coupled to, the heat sink 104.

A variety of criteria can be used in selecting the phase change material 108 for the heat sink 104, including, but not limited to, the phase transition temperature of phase change material 108 relative to the temperature limits of the electronic device(s) 106 or associated power system 100, the high latent heat capacity of the phase change material 108, the compatibility of the phase change material 108 with the material(s) of the heat sink 104, the temperature stability of the phase change material 108 under thermal cycling conditions, and the cost of the phase change material 108. For example, according to certain embodiments, the phase change material 108 can have a melting temperature in the range of around 90 degrees Celsius to around 120 degrees Celsius. Additionally, the amount of phase change material 108 used with the heat sink 104 can be based on a variety of factors. For example, according to certain embodiments, the amount of phase change material 108 can be based, at least in part, on the ability of the phase change material 108 to protect the electronic device(s) 106 from overheating for a specific period of time.

A variety of different phase change materials 108 can be used with the cooling system 102, including, for example, organic and non-organic phase change materials 108. Further, the selected phase change material 108 can be a material that, when the phase change material 108 reaches a critical temperature as the phase change material 108 absorbs heat, changes phase from a solid to a liquid, and which can later, upon a reduction in the temperature the phase change material 108, release its stored latent heat and solidify. According to certain embodiments, the phase change material 108 can comprise paraffin materials, microcrystalline waxes, polyethylene waxes, and/or combinations thereof, among other phase change materials. Alternatively, according to other embodiments, the phase change material can be a solid/solid phase change material, which during phase transition does not experience a change in volume but instead undergoes an alternation in its crystalline structure.

According to certain embodiments, the phase change material 108 can be embedded or encased within a portion of the heat sink 104 at a location that is generally remote from the proximate end 118 of the heat sink 104. For example, according to the embodiment illustrated in FIG. 1, the phase change material 108 is embedded or encased within a portion of the heat sink 104 that is at, or around, the distal end 120 of the heat sink 104, and is not at, or around, the proximate end 118 of the heat sink 104. For example, referencing the embodiment depicted in FIG. 1, the phase change material 108 is embedded or encased within the lower base plate 124 at, or around, the distal end 120 of the heat sink 104, and is not located at, or around, the upper base plate 122.

According to the exemplary embodiment illustrated in FIG. 1, during generally normal operation of the cooling system 102, at least a portion of the heat that is generated by the operation of electronic device(s) 106 is generally transferred primarily by conduction through the upper base plate 122 and fins 126 of the heat sink 104, and is dissipated via forced convection that is generated by the impeller 110 and into the ambient air. Thus, during normal operating conditions of the cooling system 102, such as, for example, when at least the impeller 110 is generally operating normally, the phase change material 108 can have minimal, if any, involvement, in the operation of the cooling system 102. Additionally, by limiting the position of the phase change material 108 at a location that is relatively remote from the proximate end 118 of the heat sink 104, and thus away from the electronic device(s) 106, the phase change material 108 may not provide a heat flux obstruction in the main thermal path along the heat sink 104, such as, for example, a thermal path along at least the plurality of fins 126 and/or first and second sidewalls 128, 130 in direction generally away from the proximate end 118 and toward the distal end 120 of the heat sink 104. Thus, by positioning the phase change material 108 at a location that is generally remote from the proximate end 118 of the heat sink 104, and thus away from the electronic device(s) 106, the heat sink 104 can operate in a manner that is generally similar to a heat sink 104 that does not include a phase change material 108, including not having issues associated with heat flux obstruction that can otherwise be associated with at least some manners of incorporation of phase change materials.

Thus, while during generally normal operation of the cooling system 102 heat is transferred by conduction through the upper base plate 122 and fins 126 of the heat sink 104, the inclusion of the phase change material 108 at a location that is generally remote from the proximate end 118 of the heat sink 104 can, in at least certain situations, provide the cooling system 102 with the ability to at least temporarily passively protect the electronic device(s) 106 and/or associated power system 100. Moreover, the phase change material 108 can provide at least a temporary cooling source via at least temporary additional heat capacity for the cooling system 102 via the relatively large latent heat capacity of the phase change material 108. Accordingly, in the event of a failure or interruption in the operation of the impeller 110, an emergency heat flux path can extend to the distal end 120 of the heat sink 104 in a manner that can utilize the increased thermal capacity that is provided by the phase change material 108 to at least attempt to maintain temperatures for an extended period of time at levels that can prevent damage to at least the electronic device(s) 106 and/or the power system 100.

Figure 2:
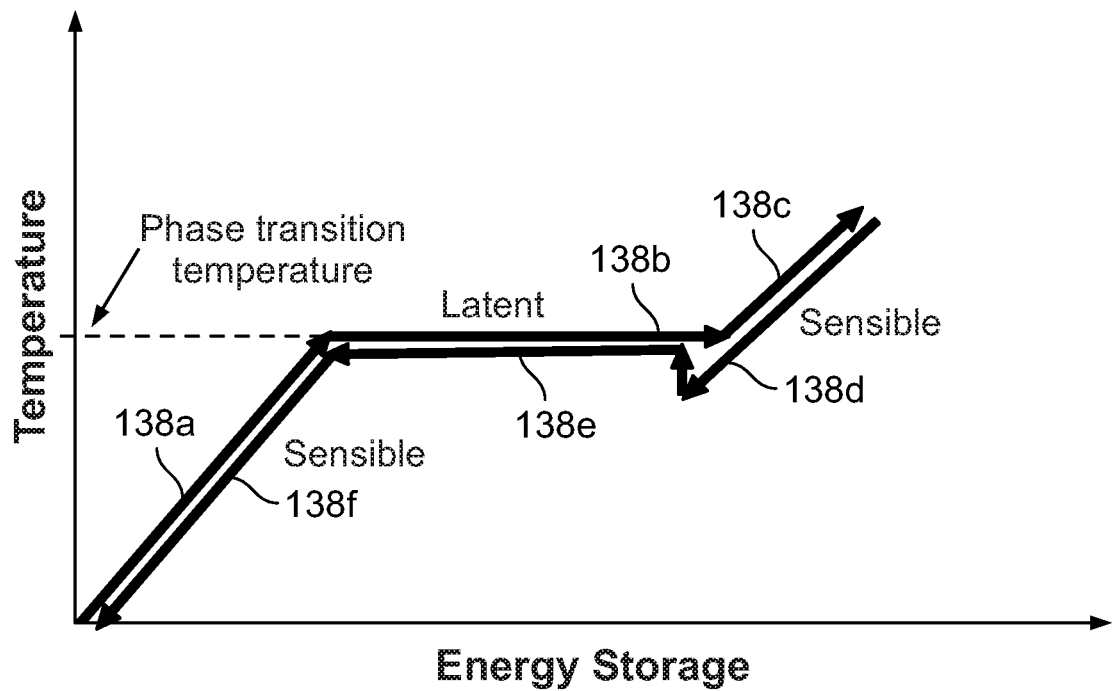
FIG. 2 illustrates an exemplary graphical representation of temperature profile as a function of stored thermal energy for a phase change material.

For at least purposes of discussion, FIG. 2 illustrates a representation of temperature profile as a function of stored thermal energy for an exemplary phase change material 108 of the cooling system 102. As depicted by a first line segment 138a, in the event of a failure in the cooling system 102, such as, for example, a failure or interruption in the operation of the impeller 110, the amount of energy in the form of sensible heat that is being absorbed by the phase change material 108 can at least initially increase. As shown, this absorbed sensible heat can result in an increase in the temperature of the phase change material 108. If the phase change material continues to absorb heat, such as, for example, in the event normal operation of the impeller 110 has not yet resumed, the temperature of the phase change material 108 can be raised to a critical or transition temperature at which the phase change material 108 changes phase, such as, for example, changes from a solid phase to a liquid phase. As discussed below, at this critical temperature, the latent heat capacity of the phase change material 108 can allow the phase change material 108 to continue to store energy while the temperature of the phase change material 108 remains relatively constant over an extended period of time, as indicated by the second line segment 138b. As indicated by the third line segment 138c, following the change in phase, the phase change material 108 can continue to absorb sensible heat and experience an associated increase in temperature until either the thermal capacity of the phase change material 108 is reached or normal operation of the cooling system 102 resumes.

According to certain embodiments, upon resumption of generally normal operation of the cooling system 102 and/or impeller 110, heat that has been absorbed by the phase change material 108 can be relatively gradually discharged to the ambient environment. Thus, with the return of the cooling system 102 to operation in which heat is primarily transferred by induction through the upper base plate 122 and fins 126 of the heat sink 104, and is dissipated by forced convection generated from the impeller 110, the phase change material 108 will eventually return to its initial condition, or its condition prior to the failure or interruption in the operation of the impeller 110. For example, referencing the fourth line segment 138d in the exemplary graphical representation shown in FIG. 2, with resumption of the normal operation of the cooling system 102, such as resumption in the operation of the impeller 110, the phase change material 108 can begin to release stored sensible heat, which can facilitate a reduction in the temperature of the phase change material 108. As the temperature of the phase change material 108 continues to decrease, the phase change material 108 can reach a temperature at which the phase change material 108 undergoes a phase change that, according to the illustrated example, reverts the phase change material 108 back from a liquid phase to a solid phase, as indicated by the fifth line segment 138*e*. Further, as shown by the fifth line segment 138*e* in FIG. 2, such solidification of the phase change material 108 can occur over a period of time during which the phase change material 108 releases latent heat. Following the change in phase and the release of latent heat, the temperature of the phase change material 108 can continue to decrease as the phase change material 108 releases sensible heat, as indicated by the sixth line segment 138*f*.

Figure 3:
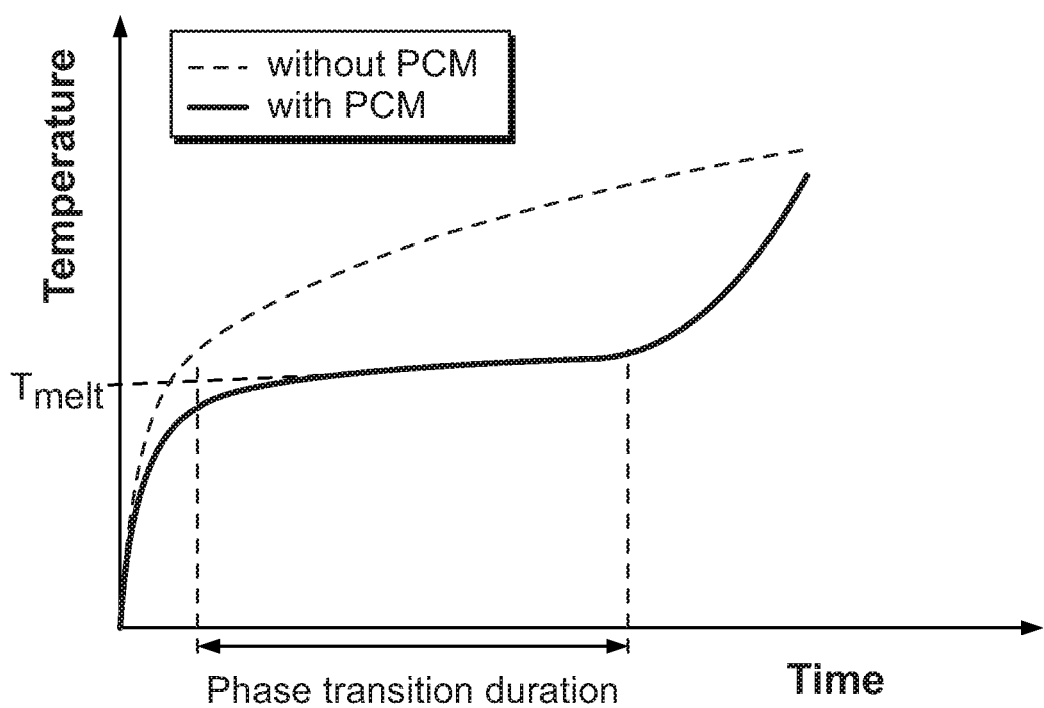
FIG. 3 illustrates an exemplary graphical representation of the impact the inclusion of phase change materials in cooling systems such as that depicted in FIG. 1 can have on power system temperature during failure of a cooling system impeller.

FIG. 3 illustrates an exemplary graphical representation of the impact the inclusion of phase change materials in cooling systems such as that depicted in FIG. 1 can have on power system temperature during failure of cooling system impeller. Moreover, FIG. 3 depicts a comparison of the temperature over time between a power system that includes one or more electronic devices 106 that utilizes a cooling system that incorporates a phase change material 108 (as indicated by "with PCM" in FIG. 3), such as the cooling system 102 of the power system 100 shown in FIG. 1, and a power system in which a similar cooling system does not incorporate phase change material (as indicated by "without PCM" in FIG. 3). As shown in FIG. 3, when the system that incorporates the phase change material 108 reaches a critical temperature (as indicated by "$T_{melt}$" in FIG. 3), the phase change material 108 can undergo a phase transition, such as, for example, a transition for a solid phase to a liquid phase. As previously discussed, when the phase change material 108 reaches the critical temperature, the latent heat capacity of the phase change material 108 is activated, which, as indicated by FIG. 3, can be at almost a constant temperature over the duration of the phase transition. Thus, as the power system temperature remains relatively consistent during such activation of the latent heat capacity of the phase change material 108, the power system temperature during the duration of the phase change transition is generally controllable. Conversely, with respect to the power system that does not include the phase change material, the power system temperature continuously increases, thereby decreasing the changes of survivability of the power system and/or decreasing the amount of time that the operator has to restore normal operation of the impeller 110. Moreover, as shown, integration of phase change material 108 into the heat sink 104 that can store thermal energy at a generally constant temperature during the duration of the phase transition can provide a reliable extension to the period of operation of the power system 100 before that associated electronic device(s) 106 or power system reach temperatures that could result in damage to, and/or failure of, the electronic device(s) 106 and/or the power system 100.

Additionally, this extended survivability period that is provided by the inclusion of the phase change materials 108 can provide a period of time in which the cooling system 102 can be repaired without interrupting the operation of the associated electronic device(s) 106 or power system 100, or can otherwise allow for the system 100 to be reliably stopped without an abrupt halt of the associated process. More specifically, the extended time available during the activation of the latent heat capacity of the phase change material 108 can also provide an extended period of time during which maintenance personnel can be notified and respond to a detected failure or interruption in the normal operation of the cooling system 102, including, for example, respond to a notification of a failure of the impeller 110. Thus, according to certain embodiments, the cooling system 102 can also include a control circuit 112 (FIG. 1), such as, for example, the control circuit 112 of a solid-state switching device, that can be electronically coupled to a temperature sensor 114 and which is configured to detect an increase in temperature that is associated with the a failure or interruption in the normal operation of the cooling system 102, as well as output an alarm signal provides an indication of the detected temperature increase. According to certain embodiments, the temperature sensor 114 can be coupled to one or more components of the cooling system 102, including, for example, a proximate end 118 of the heat sink 104.

The control circuit 112 can take a variety of forms, including, for example, being an analogue integrated circuit that includes op-amps, comparators, and/or logic ports, among other components and/or circuitry. Additionally, the control circuit can include one or more processing devices, such as, for example, Arithmetic-Logic Units (ALUs), Central Processing Units (CPUs), Digital Signal Processors (DSPs), or the like. The processing device can also be dedicated to the performance of just the operations described herein, or can be utilized in one or more additional applications. In the depicted form, the processing device is of a programmable variety that executes algorithms and processes data in accordance with operating logic as defined by programming instructions (such as software or firmware) stored in a memory of the processing device, control circuit 112, and/or other components of the power system 100. The memory can store data that is manipulated by the operating logic of processing device, such as, for example, data representative of signals received from and/or sent to an input/output device of the processing device and/or control circuit 112, in addition to, or in lieu of, storing programming instructions defining the operating logic. The control circuit 112 can also include a measurement circuit with signal conditioning that can use information provided by the temperature sensor 114 in connection with the control circuit 112 being able to monitor the temperature of at least the cooling system 102 and/or power system 100. Additionally, according to certain embodiments, a diagnostic circuit can also be embedded into the control circuit 112 that can analyze a variety of information, including, but not limited to, temperature information that is attained from the measurement circuit and/or the temperature sensor 114.

According to such an embodiment, using information detected by the temperature sensor, the control circuit 112 can be configured or programmed to output an alarm signal, such as, for example, a signal that is used in connection with illuminating a warning light(s) and/or generating an audible alarm that can be transmitted from a speaker that can provide a notification of an actual or potential failure of the cooling system 102. The temperature that is detected by the temperature sensor 114 that can trigger the control circuit 112 outputting the alarm signal can vary. For example, according to certain embodiments, the control circuit 112 can output the alarm signal when the temperature heat sink 104 indicates that the phase change material 108 is being elevated to a temperature that is approaching, but has not yet reached, the critical or transition temperature for the phase change material 108. Alternatively, the control circuit 112 can be configured to output the alarm signal when the temperature information provided by the temperature sensor 114 indicates that the phase change material 108 has reached the critical or transition temperature.

Figure 4:
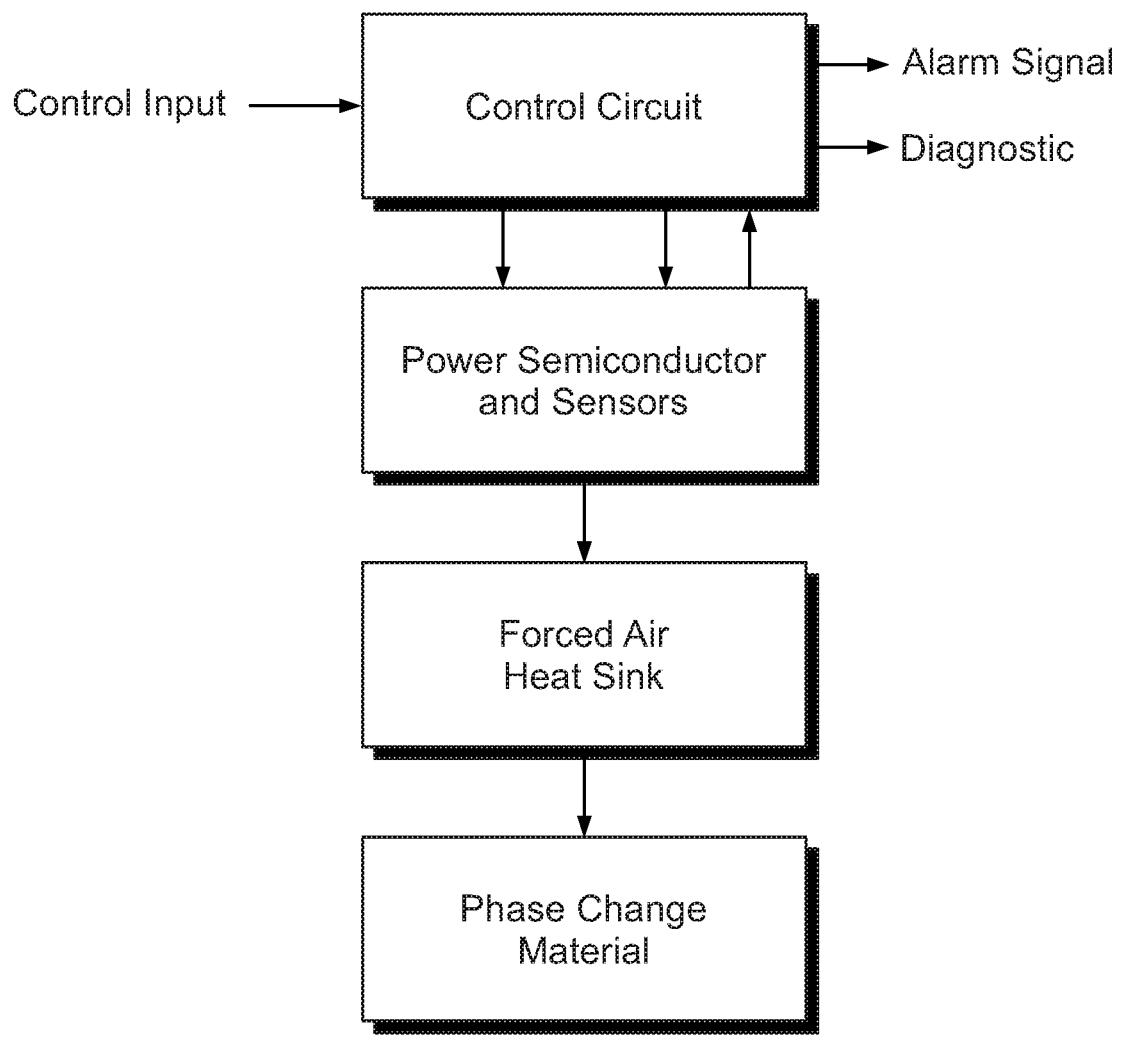
FIG. 4 illustrates a schematic diagram of an exemplary power system that includes a cooling system having a heat sink that incorporates phase change material at a position that is generally remote from a proximate end of the heat sink.

FIG. 4 illustrates a schematic diagram of an exemplary power system 100 that includes a cooling system 102 having a heat sink 104 that incorporates phase change material 108 at a position that is generally remote from the proximate end 118 of the heat sink 104. As shown, the control circuit 112 can receive information via a control input, which can include, among other information, information relating to a temperature of the power system 100 and/or cooling system 102 that is provided by the temperature sensor 114. As previously mentioned, the power system 100 can also include one or more electronic devices 106, such as, for example, a power semiconductor and associated sensors. Further, as indicated by FIG. 4, information can be exchanged between the control circuit 112 and the electronic device(s) 106, such as, for example, information that is sent to the electronic devices 106 from an output of the control circuit 112, as well as information that is received by an input of the control circuit 112 from the electronic device(s) 106. Additionally, the control circuit 112 can also output a variety of diagnostic information to other components of, or that are in communication with, the power system 100. As further indicated by FIG. 4, heat generated by the electronic devices 106 can be transferred to the heat sink 104 for transfer primarily by conduction through the heat sink 104 and dissipation by the impeller 110, as previously discussed. Further, as also previously discussed, in the event of failure of the cooling system 102, such as failure or interruption in the operation of the impeller 110, the phase change material 108 can then be used as a temporary cooling source for the cooling system 102. As also shown by FIG. 4, in the event cooling system 102, such as the impeller 110, fails and/or upon detection that the cooling system 102 is at least temporarily primarily relying on the cooling capacities provided by the phase change material 108, the control circuit 112 can output the alarm signal.

Figure 5:
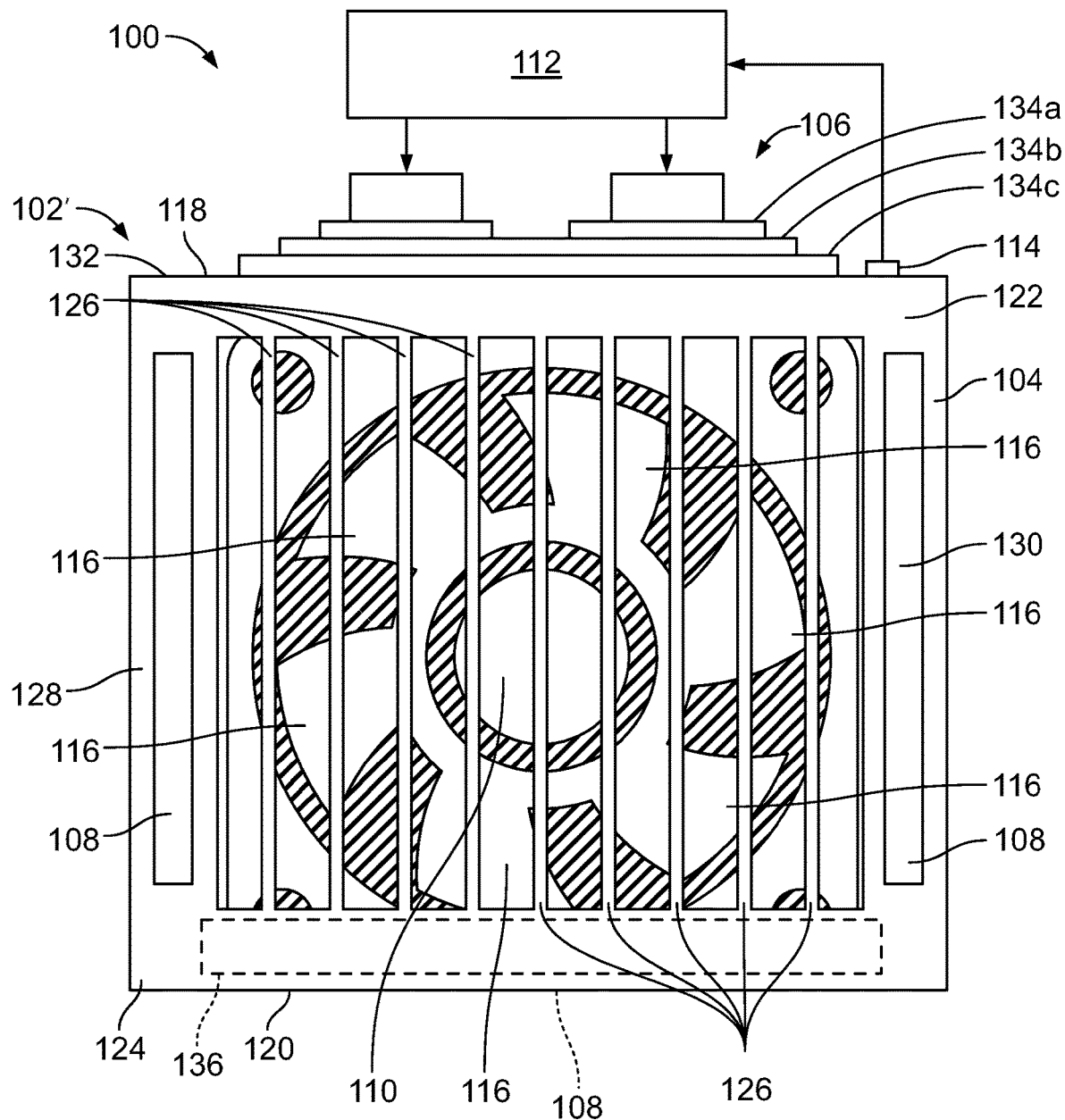
FIG. 5 illustrates a side view of a power system having an exemplary cooling system that includes a heat sink that incorporates a phase change material at a plurality of locations about the heat sink that are generally remote from a proximate end of the heat sink.

While FIG. 1 illustrates an example of the phase change material 108 being integrated into the heat sink 104 at a location that is generally remote from the proximate end 118 of the heat sink 104, namely the incorporation of the phase change material 108 into the lower base plate 124, the phase change material 108 can positioned at a variety of other, or additional, locations. For example, as shown by the cooling system 102' for the power system 100 depicted in FIG. 5, the phase change material 108 can be incorporated into one or both of the first and second sidewalls 128, 130, in addition to, or in lieu of, being incorporated into the lower base plate 124.

Figure 6:
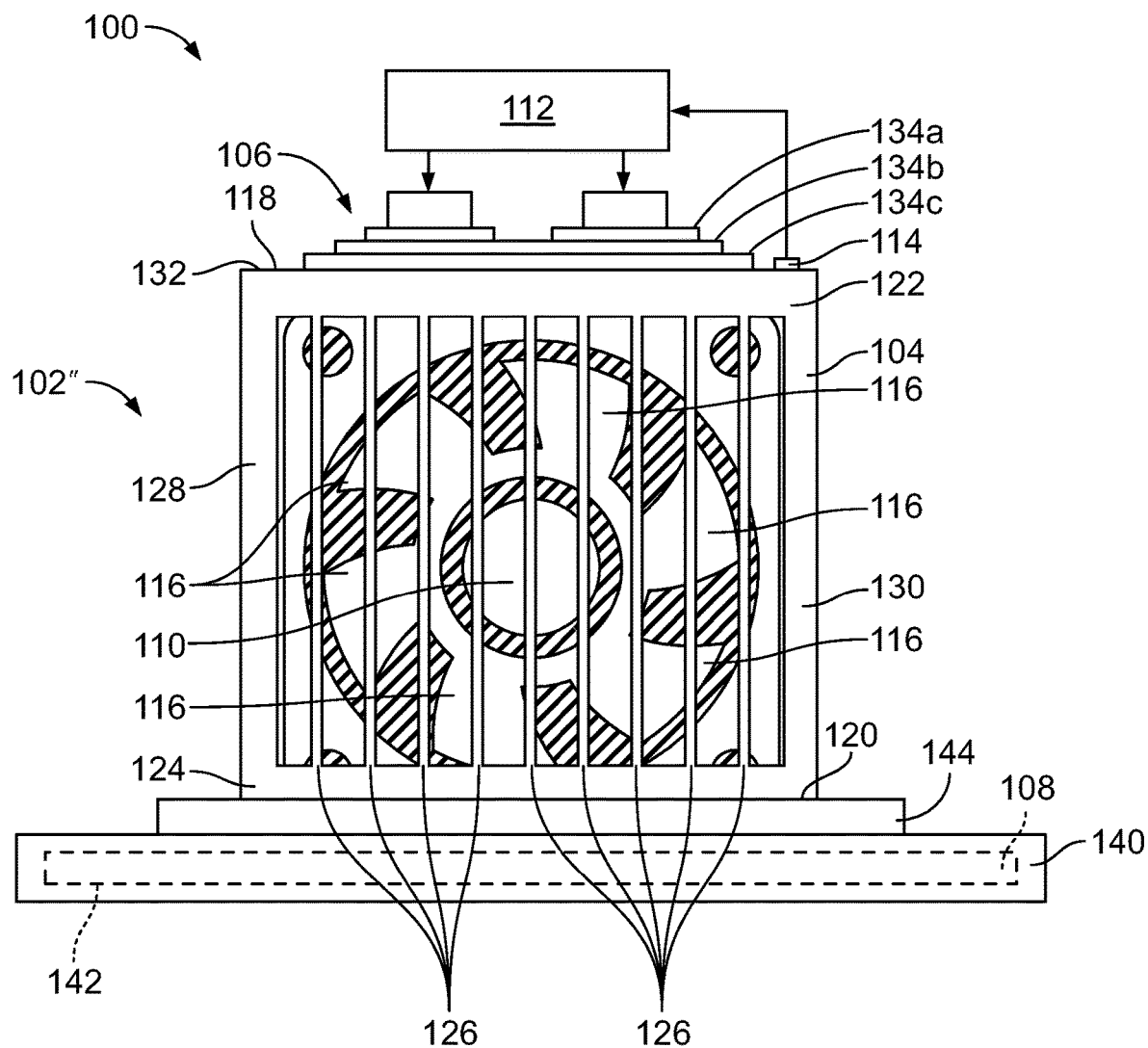
FIG. 6 illustrates a side view of a power system having an exemplary cooling system that includes a heat sink that is coupled to a panel that incorporates a phase change material.

Additionally, often at least certain types of electronic devices 106 are mounted inside a control panel, a power panel, a cabinet, or other types of enclosures through metal or thermally conductive connections. For example, electronic devices 106, such as contactors, circuit breakers, and relays, among other switching electrical devices or apparatus, are often mounted inside such panels, cabinets, or enclosures (referred to herein collectively a "panels") through the use of metallic or thermally conductive connections or fixtures, including, but not limited to DIN (commonly known as "Deutsches Institut fur Normung" or "German Institute for Standardization") rails or panel mounts, among other connecting fixtures. Thus, as indicated in FIG. 6, according to certain embodiments, rather than, or in addition to, being incorporated into the heat sink 104, the phase change material 108 can be embedded in the panel 140, such as, for example, within a recess or cavity 142 in the panel 140. According to such embodiments, as the DIN rail or mount, among or other fixtures 144, couples the distal end 120 of the heat sink 104 to the panel 140, the phase change material 108 remains at a location that is generally remote from the proximate end 118 of the heat sink 104, and moreover, generally remote from the associated electronic device(s) 106. Thus, similar to the cooling system 102, 102' configurations depicted in FIGS. 1 and 5, respectively, during normal operation, the cooling system 102" depicted in FIG. 6 the primarily transfer of heat that is generated from the electronic device(s) 106 is via conduction through the upper base plate 122 and fins 126 of the heat sink 104, and the heat is dissipated by forced convection generated from the impeller 110 in the ambient air. Moreover, again, with each cooling system 102, 102', 102", the positioning of the phase change material 108 at a location that is generally remote from the proximate end 118 of the heat sink 104 aids in preventing the phase change material 108 from providing a heat flux obstruction in the main thermal path along the heat sink 104 during normal operation of the respective cooling system 102, 102', 102". However, again, in the event of a failure of the cooling system 102", such as failure or interruption in the operation of the impeller 110, similar to the other cooling system 102, 102' configurations, the relatively high latent heat capacity of the phase change material 108 in the panel 140 and its associated relatively consistent temperature during the phase transition can extend the period of time during which maintenance personnel can be notified and respond to a detected failure or operation of the cooling system 102 and/or the amount to time to stop operation of the power system 100, thereby increasing the likelihood of survivability of the system 100. While the foregoing example discusses the phase change material 108 being incorporated into the panel 140, the phase change material 108 can be incorporated into other components that are generally remote from the proximate end 118 of the heat sink 104, including, for example, the above-mentioned fixtures 144, that are coupled at locations at which the phase change material 108 does not provide an obstacle to the main thermal path along the heat sink 104, but which are still positioned to provide at least a temporary increase in the thermal capacity of the cooling system 102 in the event of a failure of the impeller 110, among other failures of the cooling system 102", as previously discussed.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

The invention claimed is:

1. A system comprising:
   at least one electronic device;
   a heat sink,
     wherein the heat sink is a single housing which includes:
       a proximate end,
       a distal end,
       an upper base plate, a lower base plate,
a first sidewall,
a second sidewall, and
a plurality of fins,
the first sidewall and the second sidewall extending between the upper base plate and the lower base plate and on opposing sides of the plurality of fins,
the at least one electronic device coupled to the proximate end of the heat sink,
the plurality of fins being positioned between the upper base plate and the lower base plate;
an impeller positioned to dissipate heat away from the heat sink; and
a phase change material positioned in the lower base plate of the heat sink, the lower base plate being positioned at the distal end of the heat sink such that:
(1) during operation of the at least one electronic device and the impeller, the phase change material is outside of, and does not provide a heat flux obstruction in, a main thermal path of the heat sink that extends along the proximate end and the plurality of fins, and the phase change material at the distal end is maintained below a phase change transition temperature, and
(2) in response to an interruption in operation of the impeller during operation of the at least one electronic device, an emergency heat flux path of the heat sink extends to the distal end such that a temperature of the phase change material is raised above the phase change transition temperature.

2. The system of claim 1, wherein the upper base plate being positioned at the proximate end of the heat sink, and wherein the phase change material is positioned within the lower base plate remote from the upper base plate.

3. The system of claim 1, wherein none of the phase change material is positioned around the proximate end of the heat sink.

4. The system of claim 1, wherein the first sidewall, the second sidewall, and the plurality of fins positioned between the upper base plate and the lower base plate, the upper base plate positioned at the proximate end of the heat sink and further including a phase change material which is positioned within at least one of the first sidewall and the second sidewall.

5. The system of claim 1, wherein the system further includes a control circuit and a temperature sensor, the control circuit configured to determine a failure in an operation of the impeller based at least in part on information provided by the temperature sensor.

6. The system of claim 1, wherein the phase change material comprises at least one of a paraffin material, a microcrystalline wax, or a polyethylene wax.

7. The system of claim 1, wherein the phase change material changes from a first, solid phase to a second phase when the temperature of the phase change material is raised above the phase change transition temperature.

8. The system of claim 7, wherein the at least one electronic device comprises at least one of a power semiconductor device, a power semiconductor module, a contactor, a soft starter, a switch, a rectifier, a circuit breaker, a fuse, or a relay.

9. The system of claim 1, further comprising a panel coupled to the heat sink by one or more fixtures; and
a phase change material embedded within the panel.

10. The system of claim 9, wherein the one or more fixtures are coupled to a distal end of the heat sink.

11. The system of claim 9, wherein the heat sink has a main thermal path that extends along at least the proximate end and one or more fins of the heat sink, and further wherein the system does not include a phase change material at a location along the main thermal path.

12. The system of claim 11, wherein the one or more fixtures comprises a metal rail or a metal panel mount.

13. The system of claim 9, wherein the panel is positioned proximally adjacent to the distal end of the heat sink.

14. The system of claim 9, wherein the phase change material comprises at least one of a paraffin material, a microcrystalline wax, or a polyethylene wax, and wherein the panel comprises at least a portion of at least one of a control panel, a power panel, or a cabinet.

15. The system of claim 3, wherein the phase change material is at a location in the lower base plate that is outside of a main thermal path along the heat sink.

16. The system of claim 15, wherein the system further includes a control circuit and a temperature sensor, the control circuit configured to determine a failure in an operation of the impeller based at least in part on information provided by the temperature sensor.

17. The system of claim 16, wherein the phase change material comprises at least one of a paraffin material, a microcrystalline wax, or a polyethylene wax, and wherein the at least one electronic device comprises at least one of a power semiconductor device, a power semiconductor module, a contactor, a soft starter, a switch, a rectifier, a circuit breaker, a fuse, or a relay.

18. A system comprising:
at least one electronic device;
a heat sink,
wherein the heat sink is a single housing which includes:
a first base plate,
a second base plate,
a first sidewall,
a second sidewall, and
a plurality of fins,
the first sidewall and the second sidewall extending between the first base plate and the second base plate and on opposing sides of the plurality of fins,
the plurality of fins being positioned between the first base plate and the second base plate,
the at least one electronic device coupled to the first base plate,
the first and second base plates each being attached to, and positioned on opposing sides of, the plurality of fins;
an impeller positioned to dissipate heat away from the heat sink; and
a phase change material coupled to the second base plate,
wherein the heat sink is structured to provide a main thermal path along at least the first base plate and the plurality of fins, and wherein the phase change material is positioned at a location outside of the main thermal path such that:
(1) during operation of both the at least one electronic device and the impeller, the phase change material does not provide a heat flux obstruction in the main thermal path of the heat sink and the phase change material is maintained at a temperature below a phase change transition temperature, and
(2) in response to an interruption in operation of the impeller during operation of the at least one electronic device, an emergency heat flux path of the heat sink extends to a distal end of the heat sink such that the temperature of the phase change material is raised above the phase change transition temperature.

19. The system of claim 18, wherein the phase change material is encased or embedded within the second base plate.

20. The system of claim 18, wherein none of the phase change material is positioned around the first base plate of the heat sink.

* * * * *